United States Patent [19]

Colles

[11] 4,318,052
[45] Mar. 2, 1982

[54] WIDEBAND HIGH VOLTAGE VIDEO AMPLIFIER

[75] Inventor: Joseph H. Colles, Oceanside, Calif.

[73] Assignee: Hughes Aircraft Company, Culver City, Calif.

[21] Appl. No.: 99,173

[22] Filed: Nov. 30, 1979

[51] Int. Cl.³ .............................................. H03F 3/30
[52] U.S. Cl. .................................... 330/255; 330/267; 330/275
[58] Field of Search ................ 330/255, 263, 267, 275

[56] References Cited

U.S. PATENT DOCUMENTS 4,176,323  11/1979  Odell ................................ 330/255 X

*Primary Examiner*—James B. Mullins
*Attorney, Agent, or Firm*—Robert M. Wallace; William H. MacAllister

[57] ABSTRACT

A wideband high voltage video amplifier shares the amplification of positive and negative signal peaks between positively and negatively charging output bipolar transistors, respectively, thereby circumventing distortion of the output signal by the base-to-collector junction capacitance of each transistor.

12 Claims, 5 Drawing Figures

4,318,052

WIDEBAND HIGH VOLTAGE VIDEO AMPLIFIER

TECHNICAL FIELD

This invention, a wideband high voltage video amplifier, amplifies the video signal controlling a cathode ray tube illuminating a liquid crystal light valve in a video graphics projector.

BACKGROUND ART

Recent advances in video projectors include wide screen video graphics projectors which use a liquid crystal light valve illuminated by a xenon or carbon arc lamp to project a very bright image under the control of a cathode ray tube illuminating one side of the liquid crystal light valve. Such a light valve is described in U.S. Pat. No. 3,824,002 by Beard and assigned to the assignee of this application. One problem in such projectors is that the cathode ray tube must provide an exceptionally bright image, in the range of 4,000 to 8,000 lumens per square foot. It should be noted that normal household television images have a brightness on the order of only 50 to 100 lumens per square foot and therefore need only be driven by a video signal ranging on the order of 10 to 20 volts. On the other hand, in order to achieve the requisite brightness in the cathode ray tube used in the video projector, a video signal ranging on the order of 50 to 60 volts is required. A related problem is that the resolution of the video image displayed by the cathode ray tube is limited by the video scan rate or frequency of the video signal, which in turn is limited by the performance of amplifiers used to amplify the video signal to the requisite 50 to 60 volts dynamic range. For example, if an npn bipolar transistor is used to amplify the incoming video signal from a dynamic range of a few volts to the requisite dynamic range of 60 volts, the collector-to-base junction capacitance of the transistor is never completely discharged during oscillation at higher frequencies and voltages, which distorts the amplified output video signal by diminishing the positive going peaks of the signal and delaying the phase of the positive going peaks with respect to the input video signal, a well known problem in the art. Such distortion increases with the frequency of the video signal. This problem is particularly acute because, if it is desired to double the resolution of the video image produced by the cathode ray tube, it is necessary to quadruple the frequency or bandwidth of the video signal, as is well known to those skilled in the art. Thus, it did not seem possible to maintain, let alone double, the resolution of the video image controlling the liquid crystal light valve because of the requirement that the image be exceptionally bright, requiring a video signal having a dynamic range on the order of 60 volts.

SUMMARY OF THE INVENTION

The present invention, a wide band high voltage video amplifier capable of amplifying a video signal to the requisite 60 volt dynamic range while permitting an increase in the frequency or bandwidth of the video signal, not only maintains the frequency response required for a 525 line-per-frame video format but also permits a doubling of the video image resolution to a 1029 line-per-frame video format. The amplifier uses bipolar transistors and avoids the limitations imposed by the base-to-collector junction capacitance of each bipolar transistor by sharing the high voltage amplification between two high voltage output transistors. The first of these output transistors turns on during positive-going signal peaks only, and the second transistor turns on during negative going signal peaks only. As a result, the inability to completely discharge the base-to-collector junction of each transistor at higher voltages and frequencies does not substantially affect the amplified signal.

In order to provide a large output voltage swing, the first output transistor is connected to a relatively high bias voltage source while the second output transistor is connected to a relatively low bias voltage source. Both output transistors are controlled by first and second intermediate video signals applied to the bases of the first and second output transistors respectively. The first intermediate video signal has a relatively high dc bias level comparable to the high dc bias source voltage applied to the first output transistor. The second intermediate video signal has a low dc bias level comparable to the low dc bias source voltage applied to the second output transistor. Both the first and second intermediate video signals are derived from the input video signal and both the first and second intermediate video signals are in phase with one another and are in phase with the input video signal.

In order to produce a large output voltage swing, the high dc bias level of the first intermediate video signal and the voltage of the high bias voltage source are selected so that the maximum swing of the input video signal causes the first transistor to swing between almost off and almost saturated. Similarly, the relatively low bias voltage of the second intermediate video signal and the low bias voltage source are selected so that the maximum swing of the input video signal causes the the second output transistor to vary between nearly saturated and nearly off. The amplified output voltage is obtained by combining the collector voltages of the first and second output transistors in a buffer circuit having a low output impedance capable of driving a capacitive load at high frequencies.

One advantage of this amplifier is that the symmetrical configuration of the circuit automatically provides for compensation between the temperature drift in the emitter-to-base voltage of the first output transistor and the temperature drift in the emitter-to-base voltage of the second output transistor, significantly improving performance.

DESCRIPTION OF THE FIGURES

The invention is best understood by reference to the accompanying drawings of which:

FIG. 2b is a plot of the time domain waveform of a first intermediate video signal generated in the video amplifier of FIG. 1 in response to the input signal of FIG. 2a;

FIG. 2c is a plot of the time domain waveform of a second intermediate video signal generated in the video amplifier of FIG. 1 in response to the input signal of FIG. 2a;

DETAILED DESCRIPTION

Figure 1:
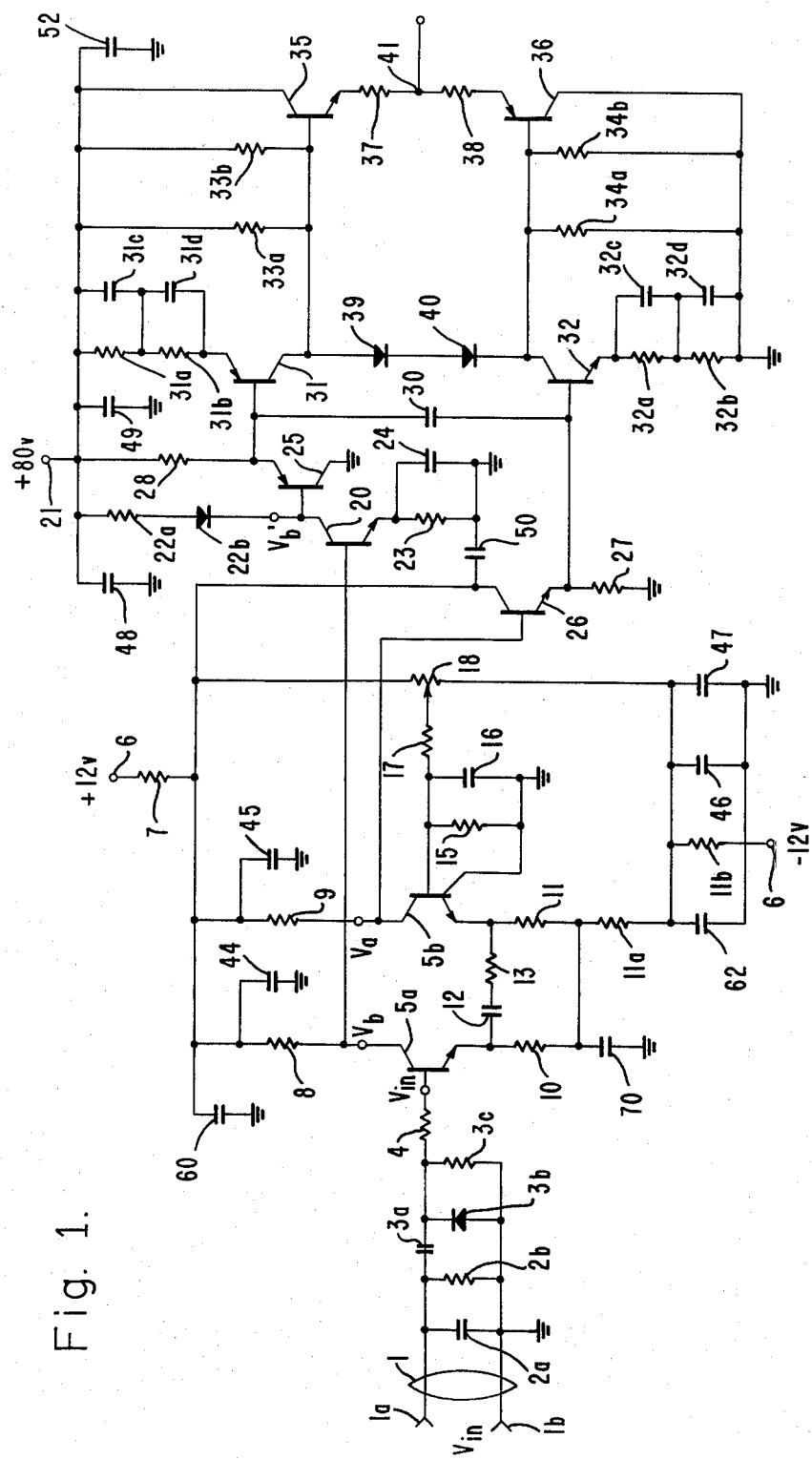
FIG. 1 is schematic diagram of the wideband high voltage video amplifier of the present invention.

The wideband video amplifier of the present invention illustrated in FIG. 1 receives a low voltage input video signal from a coaxial cable 1 having two conductors 1a, 1b which is terminated across a termination resistor 2b having a resistance corresponding to the characteristic impedance of the cable 1. A capacitor 2a having sufficient capacitance to dampen oscillations due to spurious reflections of the signal at the termination resistor 2b is connected across the resistor 2b. A clamping circuit of the type well known in the art includes a capacitor 3a connected in series with the conductor 1a, a clamping diode 3b connected across the cable conductors 1a, 1b and a resistor 3c connected across the diode 3b. The output of the clamping circuit 3a, 3b, 3c is applied through a balancing resistor 4 to the base of an npn transistor 5a.

The npn transistor 5a forms part of a common-emitter differential amplifier which generates two intermediate video signals in response to an input video signal from the cable 1. The differential amplifier comprises npn transistors 5a and 5b having their collectors connected to a +12 volt dc bias source 6 through a resistor 7 and through collector resistors 8 and 9, respectively, and their emitters connected to a negative 12 volt bias source 6a through emitter resistors 10 and 11, respectively, and through resistors 11a, 11b. High frequency variations between the emitter voltages of the transistors 5a and 5b are substantially eliminated by the series connection of balancing capacitor 12 and resistor 13 between the emitters of the transistors 5a and 5b. A dc bias level adjustment circuit comprising a resistor 15, a high frequency filter capacitor 16, a voltage divider resistor 17 and a potentiometer 18 permits selection of the voltage applied to the base of the transistor 5b. The dc bias level of collector voltages $V_a$ and $V_b$ of the transistors 5a and 5b, respectively, may be selected by moving the potentiometer 18.

Figure 2A:
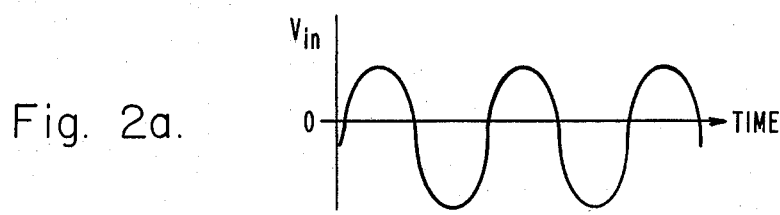
FIG. 2a is a plot of the time domain waveform of an exemplary sinusoidal input video signal which may be applied to the input of the video amplifier of FIG. 1.
Figure 2B:
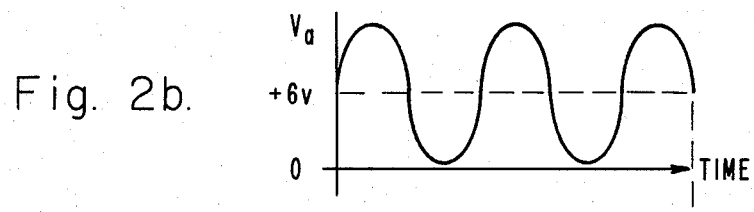
Figure 2C:
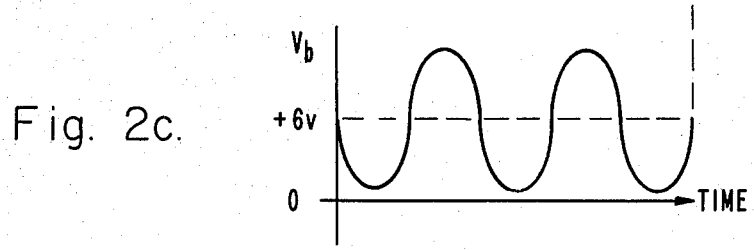

Operation of the differential amplifier is as follows. When the input video signal voltage $V_{in}$ applied to the base of the transistor 5a increases positively, the emitter-to-collector current through the transistor 5a increases, causing the collector-to-emitter current of the transistor 5b to decrease due to the common emitter connection between the two transistors. Accordingly, the collector-to-emitter voltage drop across the transistor 5a decreases, causing the collector voltage $V_a$ to decrease, while the collector-to-emitter voltage drop across the transistor 5b increases, causing the collector voltage $V_b$ to increase. Conversely, whenever the input voltage $V_{in}$ decreases, the collector-to-emitter current of the transistor 5a decreases, pushing the collector voltage $V_b$ up, while the collector-to-emitter current of the transistor 5b increases, driving the collector voltage $V_a$ down by reason of the common emitter connection. Thus, it is seen that the collector voltages $V_a$, $V_b$ follow the difference between the voltages applied to the bases of the transistors 5a, 5b, and are of opposite phase with respect to one another, the collector voltage $V_a$ being of the same phase as the input video signal $V_{in}$. The relationship of $V_{in}$ to the collector voltages $V_a$ and $V_b$ is illustrated in FIGS. 2a, 2b and 2c. Thus, $V_a$ and $V_b$ are intermediate video signals produced by the differential amplifier.

Figure 2D:
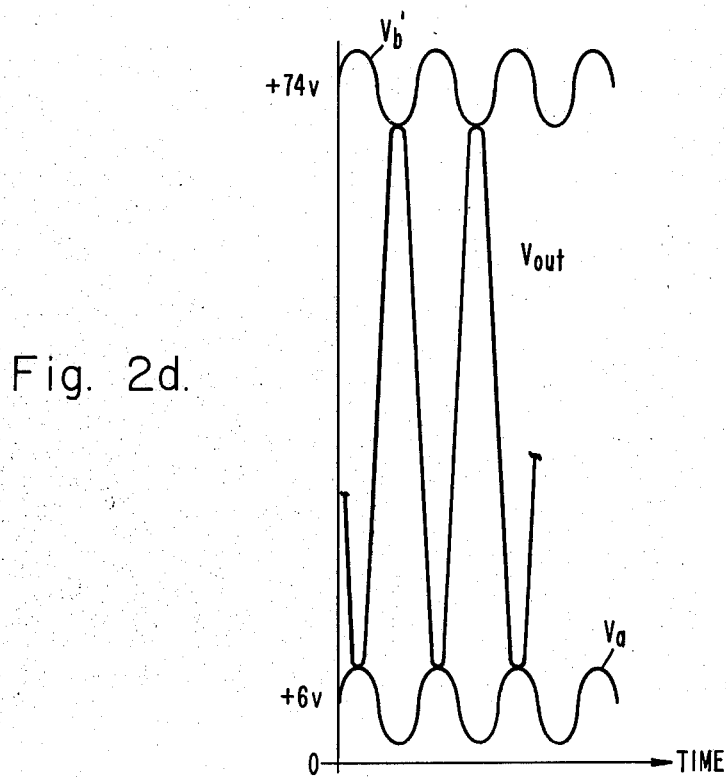
FIG. 2d includes plots of time domain waveforms superimposed upon one another, including the first intermediate video signal of FIG. 2b, the second intermediate video signal of FIG. 2c having its phase inverted and its dc bias level shifted upwardly, and the amplified video output signal produced at the output of the video amplifier of FIG. 1.

The intermediate video signal $V_b$ on the collector of the transistor 5a is applied to the base of an npn transistor 20 comprising an inverting level shifter of unity gain. The collector of the transistor 20 is connected to a +80 volt d.c. bias source 21 through a collector resistor 22a and a temperature drift compensating diode 22b, while the emitter of the transistor 20 is connected to ground through an emitter resistor 23 and a parallel peaking capacitor 24. Operation of the inverting level shifter is as follows. When the intermediate video signal $V_b$ increases in magnitude, the collector-to-emitter current of the transistor 20 increases, decreasing the voltage drop across the transistor 20 thereby decreasing the collector voltage $V_b'$ of the transistor 20. Conversely, when the intermediate video signal $V_b$ decreases in voltage, the collector-to-emitter current of the transistor 20 decreases, thereby increasing the voltage drop across the transistor 20 and increasing the collector voltage $V_b'$. Thus, it is seen that the collector voltage $V_b'$ is a new intermediate video signal which follows the video signal $V_b$ but is of inverted phase with respect thereto. Because the collector resistor 22a and the emitter resistor 23 are of equal resistance, the gain provided by the transistor 20 is unity so that the magnitude of the intermediate video signals $V_b$ and $V_b'$ is substantially equal. Significantly, because the collector of the transistor 20 is biased to a relatively high voltage (i.e., +80 V.), the dc bias level of the new intermediate video signal $V_b'$, is comparably high, and in fact is equal to the difference between the voltage of the bias source 21 (+80 V) and the dc bias level determined by the setting of the potentiometer 18, which in the preferred embodiment is approximately 6 volts. Thus, the dc bias level of the new intermediate video signal $V_b$, is approximately 74 volts. The unity gain inverting level shifter comprising the transistor 20 thus generates a new intermediate video signal $V_b'$, having its dc bias level shifted upwardly and its phase inverted with respect to the intermediate video signal $V_b$, and the result is illustrated in FIG. 2d, showing that the new intermediate video signal $V_b'$ is in phase with respect to the intermediate video signal $V_a$.

It should be noted that the intermediate video signals $V_a$ and $V_b'$ may be derived using any circuit which functions in the same way that the combination of the differential amplifier and unity gain level shifter functions. For example, the shifted intermediate signal $V_b'$ may be derived from the input video signal $V_{in}$ by means of a common base circuit instead of the differential amplifier/inverting level shifter combination described above. Substitution of other means may be possible and would be within the scope of this invention. Nevertheless, the differential amplifier/inverting level shifter combination is preferred because the differential amplifier affords good common mode operation and temperature drift compensation, enhancing high frequency operation.

In the preferred embodiment, the capacitance of all peaking capacitors such as the peaking capacitor 24 is selected to boost the gain of the amplifier of FIG. 1 at higher frequencies to compensate for roll-off due to capacitive coupling between succeeding amplifier stages.

The temperature drift compensation diode 22b compensates for temperature drift in the base-to-collector voltage of the transistor 20. The diode 22b is maintained in the same temperature environment as the transistor 20 so that temperature drift in the base-to-collector voltage of the transistor 20 is followed by an equal temperature drift in the voltage drop across the diode 22b, thus keeping the collector-to-emitter current of the transistor 20 substantially invariant over a wide range of temperatures.

The intermediate video signals $V_a$ and $V_b'$ are buffered through pnp and npn emitter follower transistors 25 and 26, respectively. Thus, the intermediate video signal $V_a$ is applied to the base of npn transistor 26 having its collector connected through the collector resistor 7 to the +12 volt bias source 6 and its emitter connected through emitter resistor 27 to ground. The intermediate video signal $V_b'$ is applied to the base of the pnp transistor 25 having its emitter connected to the +80 volt bias source 21 through emitter resistor 28 and its collector connected to ground. The transistors 25 and 26 buffer the transistors 20 and 5b, respectively, from succeeding stages of the amplifier of FIG. 1, and their emitter voltage waveforms are substantially the same as the intermediate video signals $V_b'$ and $V_a$ respectively.

Although FIG. 2d indicates that the intermediate video signals $V_a$ and $V_b'$ are in phase with one another, certain phase differences may exist at higher frequencies, but such differences are substantially eliminated by connection of a capacitor 30 between the emitters of the transistors 25 and 26. The function of the capacitor 30 is to clamp the phase of the intermediate video signal $V_b'$ on the emitter of the transistor 25 to the phase of the intermediate signal $V_a$ on the emitter of the transistor 26.

The intermediate video signal $V_b'$ is applied from the emitter of the transistor 25 to the base of an output pnp transistor 31, while the intermediate video signal $V_a$ is applied from the emitter of the transistor 26 to the base of an npn output transistor 32. The emitter of the transistor 31 is connected through emitter resistors 31a, 31b in parallel with peaking capacitors 31c, 31d, respectively to the +80 volt bias source 21, while the collector of the transistor 31 is connected through bias resistors 33a, 33b to the source 21. The emitter of the output transistor 32 is connected through emitter resistors 32a, 32b in parallel with peaking capacitors 32c, 32d, respectively, to ground while the collector of the transistor 32 is connected through bias resistors 34a, 34b to ground. The collectors of the output transistors 31 and 32 are connected to the bases of npn and pnp output transistors 35 and 36, respectively. The collector of the npn output transistor 35 is connected directly to the 80 volt bias source 21 while the collector of the pnp output transistor 36 is connected directly to ground. An output mode is formed between the emitters of the transistors 35 and 36 through current limiting resistors 37 and 38 having equal resistance.

The bases of the output transistors 35 and 36 are connected together through diodes 39 and 40. The voltage drop across the diodes 39 and 40 maintains the base-to-emitter voltages of these transistors between the 0.5 and 0.7 volts to ensure that the transistors 35 and 36 are always at least barely on and ready to conduct. The resistors 37 and 38 are selected so that the collector-to-emitter current through the transistors 35 and 36 is limited despite the fact that these transistors are always maintained "on" by the voltage drop across the diodes 39 and 40.

The output transistors 31, 32, 35, 36 comprise the wideband high voltage output stage of the amplifier of the present invention. The high voltage amplified video signal is derived at the output node 41 between the resistors 37 and 38. The output transistors 35, 36 buffer the transistors 31, 32 from the output mode 41 and provide a low output impedance at the node 41. Selection of the position of the potentiometer 18 is preferably performed by adjusting the potentiometer 18 until the voltage at the output node 41 is 40 volts in the absence of an input signal $V_{in}$ on the base of the transistor 5a.

The dc bias level of the intermediate video signal $V_b'$ and the voltage of the bias source 21 are both chosen so that the maximum voltage swing of $V_b'$ applied to the base of the output transistor 31 causes the collector-to-emitter current of that transistor to swing between near saturation and near cut-off. In the preferred embodiment, the dc bias level of $V_b'$ is approximately +74 volts while the voltage of the dc bias source 21 is +80 volts. Similarly, the dc bias level of the intermediate video signal $V_a$ and the voltage to which the output transistor 32 is biased are both chosen so that the maximum voltage swing of $V_a$ applied to the base of the transistor 32 causes its collector-to-emitter current to swing between near saturation and near cut-off. In the preferred embodiment, the dc bias level of $V_a$ is approximately +6 volts while the transistor 32 is biased to ground.

Operation of the output stage is as follows. Whenever the intermediate video signals $V_a$ and $V_b'$ increase positively in voltage, the emitter-to-collector current through the transistor 31 decreases while the emitter-to-collector current through the transistor 32 increases because the transistors 31 and 32 are of complementary pnp and npn types, respectively. Consequently, the emitter-to-collector voltage drop across the transistor 31 increases while the collector-to-emitter voltage drop across the transistor 32 decreases, causing the base voltages on the transistors 35 and 36 to decrease. Consequently, the collector-to-emitter current through the transistor 35 decreases while the emitter-to-collector current through the transistor 36 increases, because the transistors 35 and 36 are of complementary npn and pnp type, respectively. Therefore, the transistor 36 provides a path of decreased resistance to ground from the node 41, thereby decreasing the video output voltage on the output node 41. Conversely, whenever the intermediate video signals $V_a$ and $V_b'$ decrease in voltage, the emitter-to-collector current through the transistor 31 increases while the collector-to-emitter current through the transistor 32 decreases. Consequently, the emitter-to-collector voltage drop across the transistor 31 decreases while the collector-to-emitter voltage drop across the transistor 32 increases, thereby increasing the base voltages on the transistor 35 and 36. As a result, the transistor 35 provides a path of decreased resistance between the +80 volt bias source 21 and the output node 41, while the transistor 36 provides a path of increased resistance between the output node 41 and ground. Therefore, the output voltage on the node 41 increases. If, for example, the intermediate video signals $V_a$ and $V_b'$ were sinusoids as illustrated in FIG. 2d, the output voltage $V_{out}$ on the node 41 would be of inverted phase with respect to the intermediate video signals, as illustrated in FIG. 2d.

Whereas in the prior art the collector-to-base junction capacitance caused significant distortion of the amplified output signal at high frequencies and voltages, the operation of the output stage of the amplifier of FIG. 1 circumvents such distortion. This is so because the maximum frequency of positive going peaks in the output signal $V_{out}$ on the node 41 is substantially limited only by the turn-on time of the positively charging transistors 31 and 35 and is not significantly limited by the turn-on time of the negatively charging transistors 32 and 36. Likewise, the maximum frequency of negative going peaks in the output signal $V_{out}$ on the node 41 is substantially limited only by the turn-on time of the negatively charging transistors 32 and 36 and is not substantially limited by the turn-on time of the positively transistors 31 and 35. Hence, the task of providing fast rise times for positive going peaks in the signal $V_{out}$ and the task of providing fast rise times for negative going signal peaks in the signal $V_{out}$ are shared between the positively charging output transistors 31 and 35 and the negatively charging output transistors 32 and 36, respectively. Therefore, the inability to completely discharge the base-to-collector junction capacitance of each transistor at higher voltages and frequencies substantially does not distort the video output signal $V_{out}$ on the node 41, thereby overcoming a significant limitation which has plagued the prior art.

Significantly, the video signal $V_{out}$ on the node 41 has a dynamic range of about 60 volts, ranging between approximately 10 volts and 70 volts. That the voltage swing on the output node 41 is as large as illustrated in FIG. 2d may be understood by considering that the output node 41 is connected alternately to the 80 volt bias source 21 through the transistor 35 and then is connected to groun through the transistor 36 for a sufficiently large swing in the input video signal $V_{in}$. The positive peak of the signal $V_{out}$ is limited only by the saturation voltage drop across the transistor 35, while the negative peak of the output signal $V_{out}$ is limited only by the saturation voltage drop across the transistor 36, so that $V_{out}$ has the 60 volt dynamic range illustrated in FIG. 2d.

Because the distorting effect of base-to-collector junction capacitance has been substantially eliminated in this invention, the amplifier illustrated in FIG. 1 has a bandwidth four times that required to process standard format video data of 525 lines per frame, so that the resolution of the video image may be doubled, for example, to a 1029 line per frame video format while maintaining the 60 volt dynamic range of the amplified output voltage. Thus, the amplifier may be used to drive a cathode ray tube controlling a liquid crystal light valve in a video projector, and the resolution of the image may be doubled while maintaining the 60 volt dynamic range of the amplified video signal corresponding to the requisite brightness of the video image for controlling a liquid crystal light valve.

Another advantage of the amplifier of FIG. 1 is that the symmetrical configuration of the transistors 31, 32, 35 and 36, of the buffer transistors 25 and 26 and of the differential amplifier of transistors 5a and 5b results in automatic compensation for temperature drift in the base-to-emitter voltage of each of these transistors. The output node 41 is disposed symmetrically with respect to the base-to-emitter junctions of the transistors 35 and 36 and with respect to the base-to-emitter junctions of the transistors 31 and 32. Hence, the same temperature drift in the base-to-emitter voltages of the transistors 31, 32 and 35, 36 can cause substantially no drift in the output voltage $V_{out}$ on the node 41. Therefore, the output stage performs uniformly over a wide range of temperatures, a significant advantage.

The following is a list of part numbers corresponding to the numerals used in this specification designating the discrete components illustrated in the schematic diagram of FIG. 1. All parts may be obtained from Motorola.

| Numeral | Component Value or Part Number |
| --- | --- |
| 2a: | 150 pf |
| 2b: | 75 ohm |
| 3a: | 100 microfarads, 10 volts |
| 3b: | IN 4148 (part number) |
| 3c: | 100 kohms |
| 4: | 470 ohm |
| 5a: | 2N 3839 (part number) |
| 5b: | 2N 3839 (part number) |
| 6a: | 10 ohm |
| 8: | 510 ohms |
| 9: | 510 ohms |
| 10: | 33 ohms |
| 11: | 33 ohms |
| 12: | 75 microfarads |
| 13: | 100 ohms |
| 15: | 470 ohms |
| 16: | 10 microfarads, 25 volts |
| 17: | 10 kohms |
| 18: | 1 kohm, 15t |
| 20: | 10 ohms |
| 20: | 2N 4924 (part number) |
| 22a: | 1 kohm |
| 22b: | IN 4005 (part number) |
| 23: | 1 kohm |
| 24: | 33 microfarads |
| 25: | 2N 4928 (part number) |
| 26: | 2N 2219A (part number) |
| 27: | 300 ohms, ¼ watt |
| 28: | 510 ohms, ¼ watt |
| 30: | 1 microfarad, 100 volts |
| 31: | 2N 3119 (part number) |
| 31a: | 100 ohms |
| 31b: | 47 ohms |
| 31c: | 330 microfarads |
| 31d: | 1,000 picofarads |
| 32: | 2N 3119 (part number) |
| 32a: | 47 ohms |
| 32b: | 100 ohms |
| 32c: | 1,000 picofarads |
| 32d: | 330 microfarads |
| 33a: | 4 kohms |
| 33b: | 4 kohms |
| 34a: | 4 kohms |
| 34b: | 4 kohms |
| 35: | 2N 4924 (part number) |
| 36: | 2N 4928 (part number) |
| 37: | 33 ohms |
| 38: | 33 ohms |
| 39: | IN 4005 (part number) |
| 40: | IN 4005 (part number) |

Decoupling filter capacitors 44–49 are also connected between various points in the circuit and ground and are all of 0.1 microfarad, 100 volt rating. Decoupling filter capacitors 50,52 are also connected at various points in the circuit and have a value of 1 microfarad. Decoupling filter capacitors 60,62 are connected at various points in the circuit and are of 10 microfarads, 25 volt rating. A decoupling filter capacitor 70 of 20 picofarads having a 1 kv rating is connected to the common emitters of the differential amplifiers 5a, 5b.

If the amplifier is used in a standard 525 lines-per-frame video system instead of a 1029 lines-per-frame system, it is not necessary that the amplifier perform to its maximum ability, and therefore some cost may be saved by substituting less expensive components. Specifically, Fairchild transistors 2 N 3583 and 2 N 3563 may be substitued for the transistors 5a and 5b, respectively. Furthermore, Motorola transistors 2 N 3494 and 2 N 3501 may be substituted for the transistors 31 and 32, respectively. However, such a substitution is not preferable if the amplifier is to be used with the high frequency video signals of a 1029 line-per-frame video system.

An amplifier of this invention was made in accordance with the schematic diagram of FIG. 1 and had an output voltage swing of 60 volts maximum and a frequency roll-off of not more than 3 dB at 40 megahertz.

It is possible to construct the circuit of FIG. 1 using complementary N and P channel field effect transistors in place of the complementary npn and pnp bipolar transistors 31, 32, 35 and 36. Each transistor 31, 32, 35 and 36 may be considered to have a control terminal, a current supply terminal and a current receiving terminal, which corresponds equivalently to the base, emitter and collector, respectively, of a bipolar transistor, and also corresponds equivalently to the gate, source and drain, respectively, of a field effect transistor. Thus, a P-channel field effect transistors would function in an equivalent manner in place of the pnp transistor 31 and 36, while N-channel field effect transistors would function in an equivalent manner in place of the npn transistors 32 and 35. However, the bipolar transistors listed above are preferred because of their high power rating.

What is claimed is:

1. A high voltage wideband video amplifier having a source supplying an input signal including a plurality of transistors of both npn and pnp types, comprising:
   means connected to receive said input signal and receiving power from positive and negative reduced bias voltage sources for generating two intermediate signals corresponding to said input signal, one of said intermediate signals having a first d.c. bias level, the other of said intermediate signals having a second d.c. bias level;
   a first output transistor of one of said npn and pnp types comprising a first base, a first emitter and a first collector, said first base connected to receive said one intermediate signal;
   a first resistive network circuit biasing said first collector and said first emitter to a first d.c. bias voltage source;
   a second output transistor of the other of said npn and pnp types comprising a second base, a second emitter and a second collector, said second base connected to receive the other of said intermediate signals;
   a second resistive network circuit biasing said second collector and said second emitter to a second d.c. bias voltage source;
   a first buffer transistor connected between said intermediate signal generating means and said first base of said first output transistor and a second buffer transistor connected between said second base of said second output transistor and said intermediate signal generating means;
   said first d.c. bias level and said first d.c. bias voltage source being selected so that the maximum voltage swing in said input signal causes said first output transistor to alternate between near saturation and near cutoff; and
   said second d.c. bias level and said second d.c. bias voltage source being selected so that the maximum voltage swing in said input signal causes said second output transistor to alternate between near saturation and near cutoff, wherein the relative magnitudes of said positive and negative reduced bias voltage sources of said generating means are sufficiently reduced below the relative magnitudes of the voltage of said first and second bias voltage sources so that said generating means may reliably operate at high frequencies compatable with video signals.

2. The device of claim 1 further comprising a final output stage, including:
   a third output transistor comprising a third base, a third emitter and a third collector, said third base connected to said first collector, said third collector connected to said first d.c. bias voltage source;
   a fourth output transistor comprising a fourth base, a fourth emitter and a fourth collector, said fourth base connected to said second collector, said fourth collector connected to said second d.c. bias voltage source; and
   a current limiting resistive circuit connected between said third and fourth emitters defining an output node therebetween.

3. The device of claims 1 or 2 further comprising a capacitor connected between said first and second bases having a capacitance selected so that the phases of said two intermediate signals remain substantially equal in the range of 0 to 40 megahertz.

4. The device of claim 2 further comprising a pair of diodes connected in series between said third and fourth bases, said diode selected so as to maintain said third and fourth transistors at least barely on on in the absence of an input signal.

5. The device of claim 1 wherein said generating means comprises:
   a common emitter differential amplifier receiving power from said positive and negative reduced bias voltage sources and connected to receive said input signal, said amplifier comprising:
      a first output responsive to said input signal,
      a second output responsive to said input signal having its phase inverted with respect to said input signal; and
   a unity gain inverting level shifter connected to said second output, said shifter comprising an inverting transistor biased by said second bias voltage source, said level shifter being of inverted phase with respect to said second output, and being biased at said second d.c. bias level.

6. The device of claim 1 wherein said first transistor is a pnp transistor and said first d.c. bias source is a positive voltage source, and wherein said second output transistor comprises an npn transistor and said second d.c. bias source comprises ground.

7. The device of claim 2 wherein said third transistor comprises an npn transistor and said fourth transistor comprises a pnp transistor.

8. The device of claim 2 wherein said second d.c. bias voltage source has a voltage of positive 80 volts, said first d.c. bias source comprises ground, said first d.c. bias level is approximately +74 volts and said second d.c. bias level is approximately +6 volts.

9. The device of claim 2 wherein said first d.c. bias level is selected so that the d.c. bias level of said output node is half-way between the voltages of said first and second d.c. bias voltage sources.

10. A high voltage wideband video amplifier having a source supplying an input signal including a plurality of transistors of complementary types, comprising:

means connected to receive said input signal and receiving power from positive and negative reduced bias voltage sources for generating two intermediate signals corresponding to said input signal, one of said input signals having a first d.c. bias level, the other of said intermediate signals having a second d.c. bias level;

a firt output transistor of one of said complementary types comprising a first control terminal, a first current supply terminal and a first current receiving terminal, said first control terminal connected to receive said one intermediate signal;

a resistive network circuit biasing said first current supply terminal and said first receiving terminal to a first d.c. bias source;

a second output transistor of the other of said complementary types comprising a second control terminal, a second current supply terminal and a second current receiving terminal, said second control terminal connected to receive the other of said intermediate signals;

a second resistive network circuit biasing said second current supply terminal and said second receiving terminal to a second d.c. bias voltage source;

a first buffer transistor connected between said first control terminal and said intermediate signal generating means and a second buffer transistor connected between said second control terminal and said intermediate generating means;

said first d.c. bias level and said first d.c. bias voltage source selected so that the maximum voltage swing in said input signal causes said first transistor to alternate between near saturation and near off; and said second d.c. bias level and said second d.c. bias voltage source selected so that the maximum voltage swing in said input signal causes said second transistor to alternate between near saturation and near off, wherein, the relative magnitudes of said positive and negative bias voltage sources of said generating means are sufficiently reduced below the relative magnitudes of said first and second bias voltage sources so that said generating means may reliably operate at frequencies compatible with video signals.

11. The device of claim 10 further comprising a final output stage, including:

a third output transistor comprising a third control terminal, a third current supply terminal and a third current receiving terminal, said third control terminal connected to said first current receiving terminal, said third current receiving terminal connected to said first d.c. bias voltage source;

a fourth output transistor comprising a fourth control terminal, a fourth current supply terminal and a fourth current receiving terminal, said fourth control terminal connected to said second current receiving terminal, said fourth current receiving terminal connected to said second d.c. bias voltage source; and a current limiting resistive circuit connected between said third and fourth supply terminals defining an output node therebetween.

12. The device of claim 11 in which all of said control terminals comprise bases, all of said current supply terminals comprise emitters and all of said current receiving terminals comprise collectors.

* * * * *